United States Patent
Sugie

(10) Patent No.: US 9,236,829 B2
(45) Date of Patent: Jan. 12, 2016

(54) MOTOR DRIVING CIRCUIT AND ELECTRONIC APPARATUS USING THE SAME

(71) Applicant: Rohm Co., Ltd., Kyoto (JP)

(72) Inventor: Hisashi Sugie, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 133 days.

(21) Appl. No.: 13/909,223

(22) Filed: Jun. 4, 2013

(65) Prior Publication Data

US 2013/0320902 A1 Dec. 5, 2013

(30) Foreign Application Priority Data

Jun. 5, 2012 (JP) ................................. 2012-128254

(51) Int. Cl.

| | |
|---|---|
| G05B 5/00 | (2006.01) |
| H02H 7/08 | (2006.01) |
| H02P 1/00 | (2006.01) |
| H02P 3/00 | (2006.01) |
| H02P 29/00 | (2006.01) |
| H02P 7/29 | (2006.01) |
| F16P 3/08 | (2006.01) |
| B25B 23/14 | (2006.01) |
| B25B 23/145 | (2006.01) |
| G01R 15/18 | (2006.01) |

(52) U.S. Cl.
CPC  *H02P 29/00* (2013.01); *H02P 7/29* (2013.01); *H02P 29/0038* (2013.01); *B25B 23/1405* (2013.01); *B25B 23/1453* (2013.01); *F16P 3/08* (2013.01); *G01R 15/18* (2013.01)

(58) Field of Classification Search
CPC ... B25B 23/1405; B25B 23/1453; F16P 3/08; G01R 15/18; G01R 31/343
USPC .................................................. 318/450, 70
See application file for complete search history.

(56) References Cited

U.S. PATENT DOCUMENTS

| | | | |
|---|---|---|---|
| 2005/0238335 A1* | 10/2005 | Miyazaki | ........................ 388/806 |
| 2006/0145681 A1* | 7/2006 | Trochut | ..................... 324/76.28 |
| 2007/0090819 A1* | 4/2007 | Hasegawa et al. | ............. 323/282 |
| 2008/0177433 A1* | 7/2008 | Teo et al. | ......................... 701/22 |
| 2009/0206788 A1* | 8/2009 | Ando | ............................. 318/696 |

* cited by examiner

Primary Examiner — Shawki S Ismail
Assistant Examiner — Bradley Brown
(74) Attorney, Agent, or Firm — Fish & Richardson P.C.

(57) ABSTRACT

A motor driving circuit for driving a motor, includes: a detecting circuit configured to detect a detection signal indicative of a current state of the motor; a command value generating unit configured to generate a command value indicative of a target state of the motor; an error amplifier configured to generate an error signal by amplifying an error between the detection signal and the command value; a pulse width modulator configured to generate a pulse signal; and an output circuit. The command value generating unit is configured to provide a variation to the command value.

18 Claims, 9 Drawing Sheets

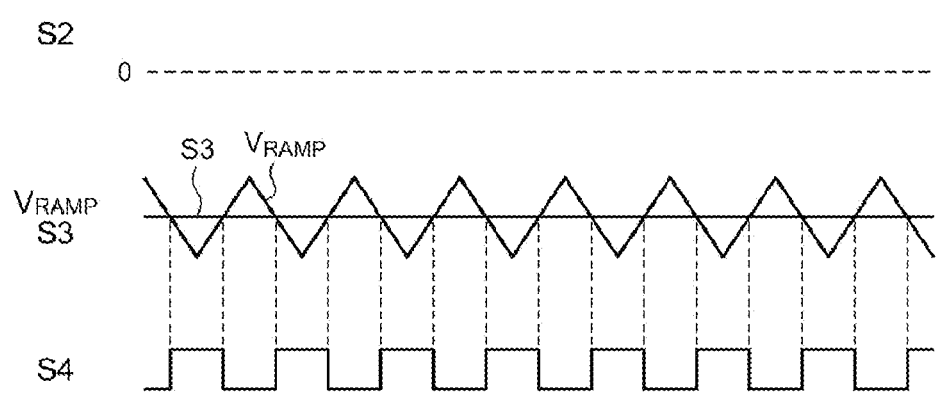
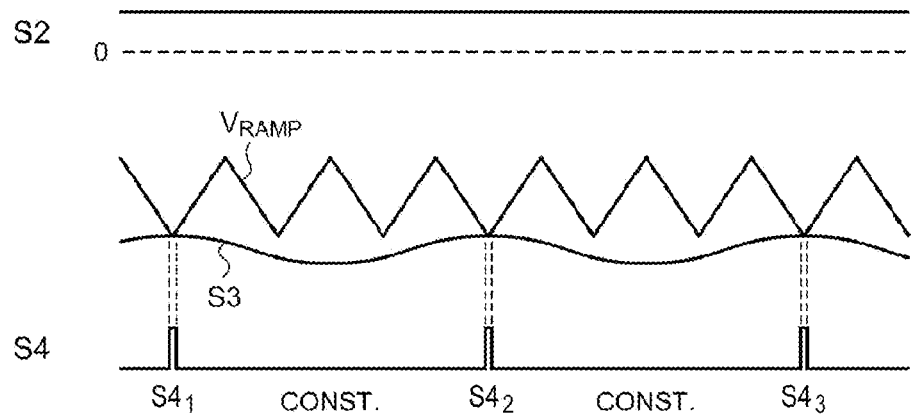

MOTOR DRIVING CIRCUIT AND ELECTRONIC APPARATUS USING THE SAME

CROSS-REFERENCE TO RELATED APPLICATION

This application is based upon and claims the benefit of priority from Japanese Patent Application No. 2012-128254, filed on Jun. 5, 2012, the entire contents of which are incorporated herein by reference.

TECHNICAL FIELD

The present disclosure relates to a motor driving circuit for switch-driving a motor.

BACKGROUND

A voice coil motor, a spindle motor or a stepping motor is used to position or rotate an object. A motor driving circuit adjusts power supplied to a motor through a feedback control such that a detecting signal indicating a current state of the motor reaches a command value indicating a target state of the motor.

Such a motor driving scheme may be generally classified into a linear driving type and a switching driving type. For the switch-driving type, a pulsed driving voltage having a switching frequency is supplied to a motor. In the motor driving circuit, the switching frequency is frequently set to an out-of audible band, for example, about 50 kHz in order to limit sound noises.

In motor driving circuits of the switch-driving type, the following problem may occur. Specifically, it has been found that, even when the switching frequency is set to the out-of audible band, an effective frequency of the pulsed driving voltage falls within an audible band due to a response delay of an error amplifier disposed in a feedback loop, which may result in audible noises.

SUMMARY

The present disclosure provides various embodiments of a motor driving circuit, which is capable of reducing audible noises.

According to some embodiments of the present disclosure, there is provided a motor driving circuit for driving a motor, including: a detecting circuit configured to detect a detection signal indicative of a current state of the motor; a command value generating unit configured to generate a command value indicative of a target state of the motor; an error amplifier configured to generate an error signal by amplifying an error between the detection signal and the command value; a pulse width modulator configured to generate a pulse signal having a duty cycle corresponding to the error signal; and an output circuit configured to apply a switching voltage having a duty cycle corresponding to the pulse signal across the motor. The command value generating unit is configured to provide a variation to the command value.

With this configuration, by varying the command value such minutely that it has little effect on a state of the motor, even when an effective switching frequency falls within an audible band, its spectrum can be spread out, which can result in a reduction of audible noises.

The command value generating unit may include a set voltage generating part configured to generate a set voltage; and a first D/A converter configured to generate the command value, the first D/S converter having a reference voltage terminal receiving the set voltage and an input terminal receiving a digital value representing the command value. The set voltage generating part may be configured to provide a variation to the set voltage.

The set voltage generating part may include: a set data generating portion configured to generate digital set data corresponding to the set voltage; and a second D/A converter configured to convert the set data into an analog set voltage. The set data generating portion may be configured to provide a variation to the set data. With this configuration, noises can be suppressed by digital control.

The set data generating portion may vary the set data by one LSB (Least Significant Bit) at a predetermined period.

The set voltage generating part may modulate the set voltage with a predetermined frequency. The predetermined frequency is preferably within a range of 1 Hz to 20 kHz.

The command value generating unit may include: a set voltage generating part configured to generate a set voltage; a micro step generating part configured to generate a digital value representing the command value; and a first D/A converter configured to generate the command value, the first D/S converter having a reference voltage terminal receiving the set voltage and an input terminal receiving a digital value representing the command value. The micro step generating part may be configured to provide a variation to the digital voltage. Audible band noises can be suppressed by varying a digital value representing the command value.

The detecting circuit may generate a detection signal representing a voltage applied to the motor.

The detecting circuit may be configured to have a first output terminal from which one of the voltages ("the first output voltage") of the first and second terminals of the motor is output, the first output voltage having a fixed voltage level, and a second output terminal from which the other voltage ("the second output voltage") of first and second terminals of the motor is output, the second output voltage being switched. The error amplifier may include: an operational amplifier; a first capacitor connected between an inverted input terminal of the operational amplifier and a non-inverted input terminal thereof; a first resistor connected between the non-inverted input terminal of the operational amplifier and the first output terminal of the detecting circuit; a second resistor connected between the non-inverted input terminal of the operational amplifier and an output terminal of the command value generating unit; third and fourth resistors connected in series between the second output terminal of the detecting circuit and the inverted input terminal of the operational amplifier; and a fifth resistor connected between a node between the third resistor and the fourth resistor and a ground terminal.

The detecting circuit may generate a detection signal representing a current flowing into the motor.

According some other embodiment of the present disclosure, there is provided a motor driving circuit for driving a motor, including: a detecting circuit configured to detect a detection signal indicative of a current state of the motor; a command value generating unit configured to generate a command value indicative of a target state of the motor; an error amplifier configured to generate an error signal by amplifying an error between the detection signal and the command value; a pulse width modulator configured to generate a pulse signal having a duty cycle corresponding to the error signal; and an output circuit configured to apply a switching voltage having a duty cycle corresponding to the pulse signal across the motor. A feedback loop including the error amplifier is configured to vary a time constant of the feedback loop.

With this configuration, by varying the time constant of the feedback loop, a speed of variation of the error signal can be changed to suppress audible noises.

The time constant may be set to have a larger value if the command value remains at a constant value for a predetermined period.

The error amplifier may include: an operational amplifier; and a variable feedback capacitor connected between an output of the operational amplifier and an input thereof.

The error amplifier may include: an operational amplifier having a non-inverted input terminal to which a reference voltage is input; a sixth resistor and a second capacitor connected in series between an output terminal of the operational amplifier and an inverted input terminal thereof; a third capacitor connected between the output terminal of the operational amplifier and an inverted terminal thereof; a seventh resistor connected between a terminal to which the command value is input and the inverted input terminal of the operational amplifier; and an eighth resistor connected between a terminal to which the detection signal is input and the inverted input terminal of the operational amplifier.

The detecting circuit may generate a detection signal representing a current flowing into the motor. The detecting circuit may include: a detecting resistor connected in series to the motor; and a sense amplifier for amplifying a voltage drop of the detecting resistor.

The detecting circuit may generate a detection signal representing a voltage applied to the motor.

According to another embodiment of the present disclosure, there is provided a motor driving circuit for driving a motor, including: a detecting circuit configured to detect a detection signal indicative of a current state of the motor; a command value generating unit configured to generate a command value indicative of a target state of the motor; an error amplifier configured to generate an error signal by amplifying an error between the detection signal and the command value; a pulse width modulator configured to generate a pulse signal having a duty cycle corresponding to the error signal; and an output circuit configured to apply a switching voltage having a duty cycle corresponding to the pulse signal across the motor. The pulse width modulator is configured to provide a variation to a frequency of the pulse signal.

With this configuration, by changing a switching frequency directly, its spectrum can be spread out or the switching frequency can be prevent from entering an audible band, which can result in a reduction of audible noises.

According yet some other embodiment of the present disclosure, there is provided a motor driving circuit for driving a motor, including: a detecting circuit configured to detect a detection signal indicative of a current state of the motor; a command value generating unit configured to generate a command value indicative of a target state of the motor; an error amplifier configured to generate an error signal by amplifying an error between the detection signal and the command value; a pulse width modulator configured to generate a pulse signal having a duty cycle corresponding to the error signal; and an output circuit configured to apply a switching voltage having a duty cycle corresponding to the pulse signal across the motor. The pulse width modulator includes: an oscillator configured to generate a ramp signal having a triangular waveform or a saw tooth waveform; and a pulse width modulation comparator configured to compare the ramp signal with the error signal. The oscillator is configured to provide a variation to a voltage range of the ramp signal.

With this configuration, by varying the voltage range of the ramp signal such minutely that it has little effect on a state of the motor, even when an effective switching frequency falls within an audible band, its spectrum can be spread out, which can result in a reduction of audible noises.

The motor driving circuit may be integrated into a single semiconductor substrate. As used herein, the term "integration" refers to formation of all circuit elements on a semiconductor substrate and integration of main circuit elements. Some resistors, capacitors and so on for adjustment of circuit parameters may be provided outside the semiconductor substrate. By integrating control circuits as a single IC, characteristics of circuit elements can be uniformly maintained while reducing a circuit area.

According to yet some other embodiment of the present disclosure, there is provided an electronic apparatus including: a motor; and the above motor driving circuit for driving the motor.

Any combinations of the above-described elements and mutual substitution of elements and expressions of some embodiments of the present disclosure between a method, an apparatus, a system and the like can be effectively used as other embodiments of the present disclosure.

BRIEF DESCRIPTION OF THE DRAWINGS

FIGS. 2A and 2B are waveform diagrams showing an operation in a case where a command value in the motor driving circuit of FIG. 1 is fixed.

DETAILED DESCRIPTION

Figure 1:
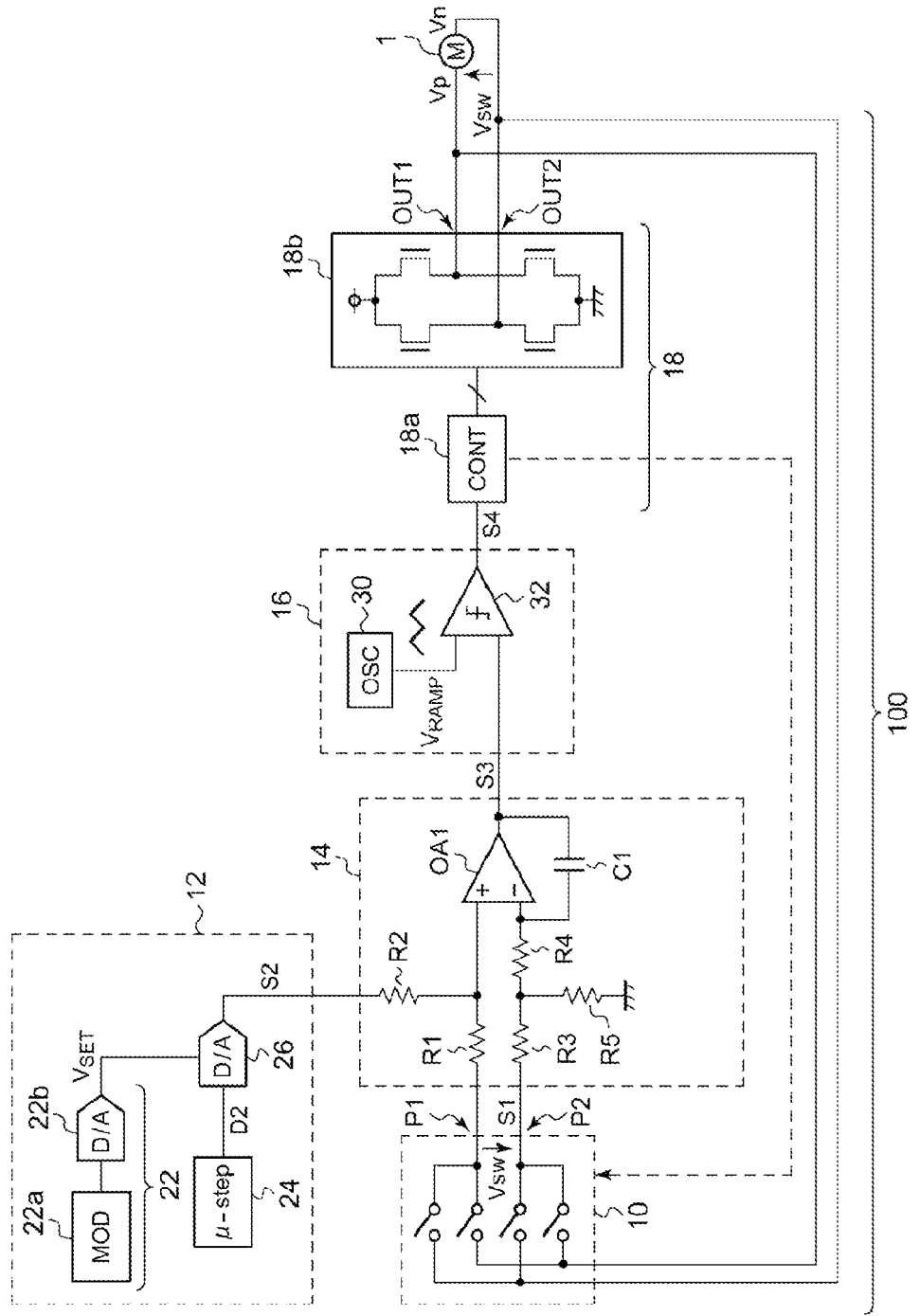
FIG. 1 is a circuit diagram of a motor driving according to a first embodiment of the present disclosure.

Reference will now be made in detail to the various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. Throughout the drawings, the same or similar elements, members and processes are denoted by the same reference numerals and explanation of which will not be repeated. In other instances, well-known methods, procedures, systems, and components have not been described in detail so as not to unnecessarily obscure aspects of the various embodiments.

In the specification, the phrase "connection of a member A and a member B" is intended to include direct physical connection of the member A and the member B as well as indirect connection thereof via other member as long as the other member has no substantial effect on the electrical connection of the member A and the member B or has no damage to functions and effects shown by a combination of the member A and the member B. Similarly, the phrase "interposition of a member C between a member A and a member B" is intended to include direct connection of the member A and the member C or direct connection of the member B and the member C as well as indirect connection thereof via other member as long as the other member has no substantial effect on the electrical connection of the member A, the member B and the member C or has no damage to functions and effects shown by a combination of the member A, the member B and the member C.

First Embodiment

FIG. 1 is a circuit diagram of a motor driving circuit 100 according to a first embodiment of the present disclosure. The motor driving circuit 100 supplies a switching voltage Vsw to a motor 1. The motor 1 may be any kind of suitable motor or similarly structured devices, including a linear actuator (such as a voice coil motor (VCM)), a spindle motor, a stepping motor and so on. The motor driving circuit 100 shown in FIG. 1 performs a feedback control of a state of the motor 1 based on an effective value of the switching voltage Vsw supplied to the motor 1.

The motor driving circuit 100 includes a detecting circuit 10, a command value generating unit 12, an error amplifier 14, a pulse width modulator 16 and an output circuit 18.

The motor driving circuit 100 generates a detection signal S1 indicating a current state of the motor 1. In this embodiment, the detection signal S1 is the switching voltage Vsw supplied to the motor 1. The detection signal S1 is smoothed by a filter at a later stage and the effective value (or a mean value) of the switching voltage Vsw is controlled to approach a targeted value.

The command value generating unit 12 generates a command value S2 to indicate a target state of the motor 1. As used herein, the term "target state" refers to a target position if, for example, the motor 1 is a linear actuator, and an RPM or a torque if the motor 1 is a spindle motor.

The error amplifier 14 amplifies an error between the detection signal S1 and the command value S2 to generate an error signal S3.

The pulse width modulator 16 generates a pulse signal S4 having a duty cycle corresponding to the error signal S3.

The output circuit 18 supplies the switching voltage Vsw to the motor 1 based on the pulse signal S4.

The command value generating unit 12 is configured to provide such a minute variation to the command value S2 to have no effect on the feedback control. This variation may be either regular or random.

A detailed configuration of each block of the motor driving circuit 100 is not particularly limited but will be described by way of an example by the following description.

The output circuit 18 includes a controller 10a and a switching output stage 18b. In this embodiment, the switching output stage 18b is an H-bridge circuit. The controller 18a drives a switch of the switching output stage 18b based on the pulse signal S4. Specifically, when the output circuit 18 drives the motor 1 in a first polarity (Vp>Vn), the output circuit 18 fixes a voltage Vn to a ground level and switches a voltage Vp. Conversely, when the output circuit 18 drives the motor 1 in a second polarity (Vp<Vn), the output circuit 18 fixes the voltage Vp to the ground level and switches the voltage Vn.

The detecting circuit 10 includes a plurality of switches. The detecting circuit 10 outputs one of the voltages Vp and Vn and applies it across the motor 1, which has a fixed voltage level, from a first output terminal P1, and outputs a switching one of the voltage Vp and Vn from a second output terminal P2.

The command value generating unit 12 includes a set voltage generating part 22 for generating a set voltage $V_{SET}$, a first D/A converter 26, and a micro step generating part 24 for generating a digital value D2 indicating the command value S2.

The micro step generating part 24 generates the digital value D2 to indicate an effective waveform of a driving voltage to be applied to the motor 1. The digital value D2 may be, for example, a sinusoidal wave or a trapezoidal wave. The first D/A converter 26 has a reference voltage terminal at which the set voltage $V_{SET}$ is received, and an input terminal at which the digital value D2 is received, and outputs the command value S2.

The set voltage generating part 22 is configured to provide a variation to the set voltage $V_{SET}$. The set voltage generating part 22 includes a set data generating portion 22a and a second D/A converter 22b. The set data generating portion 22a generates digital set data $D_{SET}$ corresponding to the set voltage $V_{SET}$. The second D/A converter 22b converts the set data $D_{SET}$ into an analog set voltage $V_{SET}$.

The set data generating portion 22a is configured to provide a variation to the set data $D_{SET}$. For example, the set data generating portion 22a varies the set data $D_{SET}$ by one LSB (Least Significant Bit) at a frequency between 1 Hz and 20 kHz. This allows the set voltage $V_{SET}$ to be minutely varied and allows a minute variation to be provided to the command value S2. In other words, the set voltage generating part 22 can modulate the set voltage $V_{SET}$ with a particular frequency.

The error amplifier 14 includes an operational amplifier OA1, a first capacitor C1 and first to fifth resistors R1 to R5.

The first capacitor C1 is interposed between an inverted input terminal and an output terminal of the operational amplifier OA1. The first resistor R1 is interposed between a non-inverted input terminal of the operational amplifier OA1 and the first output terminal P1 of the detecting circuit 10. The second resistor R2 is interposed between the non-inverted input terminal of the operational amplifier OA1 and an output terminal of the command value generating unit 12. The third and fourth resistors R3 and R4 are interposed in series between the second output terminal P2 and the inverted input terminal of the operational amplifier OA1. The fifth resistor R5 is interposed between a node between the third resistor R3 and the fourth resistor R4 and a ground terminal.

The error amplifier 14 generates the error signal S3 by amplifying an error between the detection signal S1 and the command value S2.

The pulse width modulator 16 includes an oscillator 30 and a PWM (Pulse Width Modulation) comparator 32. The oscillator 30 generates a triangular or saw waveform ramp signal $V_{RAMP}$ having a predetermined frequency. The frequency of the ramp signal $V_{RAMP}$ is set to, for example, about 50 kHz in an out-of audible band.

The PWM comparator 32 generates the pulse signal S4 having a duty cycle varied depending on a voltage level of the error signal S3 by comparing the error signal S3 with the ramp signal $V_{RAMP}$.

Figure 2C:
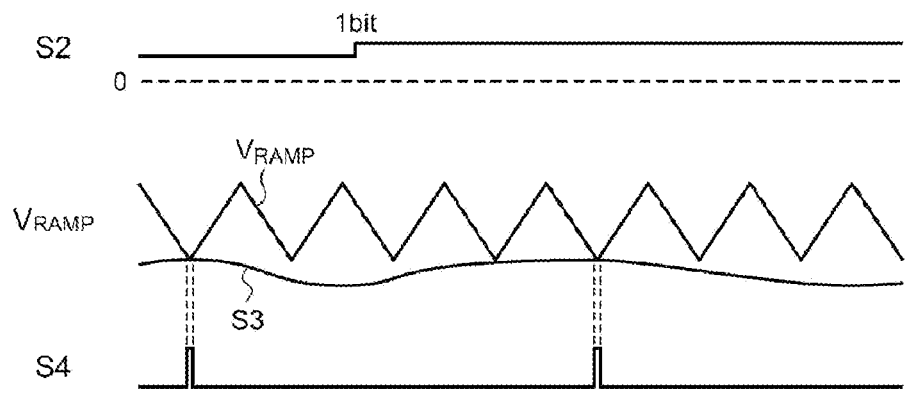
FIG. 2C is a waveform diagram showing an operation in a case where a command value in the motor driving circuit of FIG. 1 is varied.
Figure 3A:
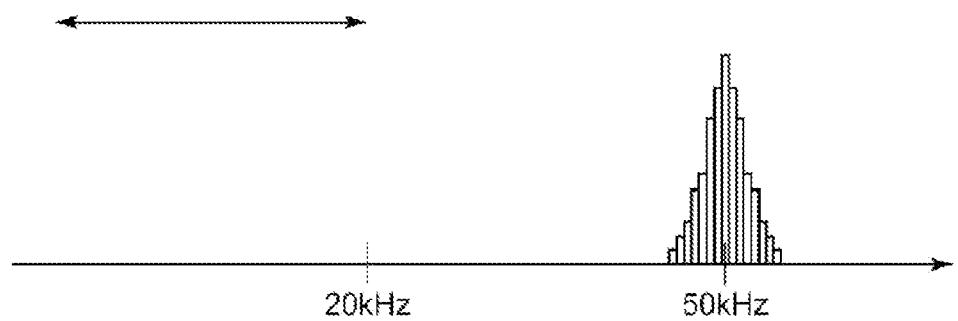
FIGS. 3A and 3B are diagrams showing spectrums in a case where a command value in the motor driving circuit of FIG. 1 is fixed.
Figure 3B:
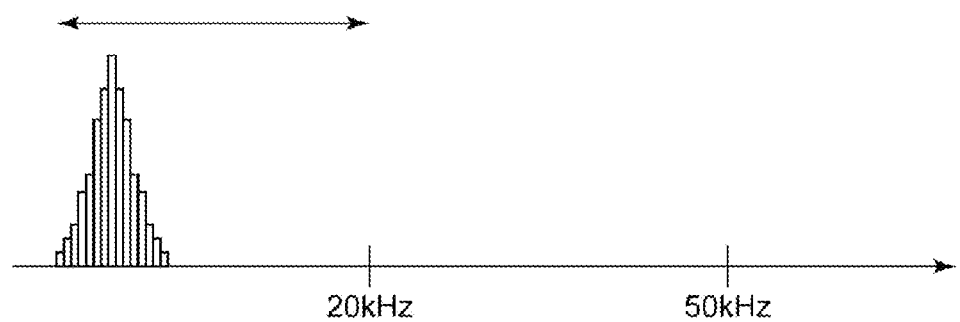
Figure 3C:
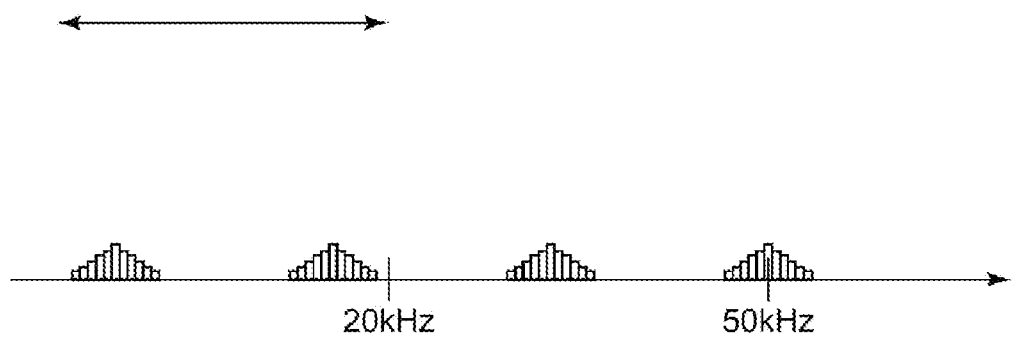
FIG. 3C is a diagram showing a spectrum in a case where a command value in the motor driving circuit of FIG. 1 is varied.

Subsequently, an operation of the motor driving circuit 100 will be described. FIGS. 2A and 2B are waveform diagrams showing an operation in a case where the command value S2 in the motor driving circuit 100 of FIG. 1 is fixed. FIG. 2C is a waveform diagram showing an operation in a case where the command value S2 in the motor driving circuit 100 of FIG. 1 is varied. FIGS. 3A and 3B are views showing spectrums in a case where the command value S2 in the motor driving circuit 100 of FIG. 1 is fixed and FIG. 3C is a view showing a spectrum in a case where the command value S2 in the motor driving circuit 100 of FIG. 1 is varied.

For the purpose of clarifying the effects of the motor driving circuit 100 of FIG. 1, an operation of a case where the command value S2 is fixed will be first described with reference to FIGS. 2A, 2B, 3A and 3B.

In FIG. 2A, the command value S2 has a value which makes a duty cycle of the switching voltage Vsw become 50%. In this case, the error signal S3 corresponds to a median value between a peak and bottom of the ramp signal $V_{RAMP}$ and the pulse signal S4 having a duty cycle of 50% is generated. Since a frequency of the pulse signal S4 is equal to a frequency (for example, 50 kHz) of the ramp signal $V_{RAMP}$ and is out of an audible band as shown in FIG. 3A, audible noises are reduced.

FIG. 2B shows an operation in the vicinity of a zero-cross, in which the command value S2 has a value that makes the duty cycle of the switching voltage Vsw become about 10%. In this case, when a first pulse $S4_1$ is generated, the detection signal S1 corresponding to the effective value of the switching signal Vsw increases and the error signal S3 decreases accordingly. With the lapse of time, the effective value of the switching voltage Vsw and the error signal S3 begins to increase. Then, when the error signal S3 crosses the ramp signal $V_{RAMP}$, a second pulse $S4_2$ is generated. In the absence of disturbance, this operation is repeated in the vicinity of the zero-cross at substantially regular intervals. The frequency of the pulse signal S4 becomes lower than the frequency of the ramp signal $V_{RAMP}$ and falls within the audible band as shown in FIG. 3B, which results in sound noises.

Subsequently, an operation in a case where the command value S2 is varied will be described with reference to FIGS. 2C and 3C. FIG. 2C shows an operation in the vicinity of a zero-cross, like FIG. 2B. The command value S2 is provided with a minute variation at a predetermined interval. When the command value S2 is varied, a waveform period of the error signal S3 is accordingly varied and an interval at which the error signal S3 crosses the ramp signal $V_{RAM}$ is varied. As a result, the frequency of the pulse signal S4 does not become constant and its spectrum is spread out as shown in FIG. 3C, which may result in a lower level of sound noises perceived by a user.

The first embodiment may have the following modifications. The command value generating unit 12 that varies the command value S2 is not limited to the operation described above. For example, the micro step generating part 24 may vary the digital value D2 with the set voltage $V_{SET}$ fixed. Alternatively, the variation of $V_{SET}$ and the variation of the digital value D2 may be used in combination.

Second Embodiment

In a second embodiment of the present disclosure, an audible noise is further reduced by controlling a time constant (or band) of a feedback loop including the error amplifier 14, in addition to providing a variation to the command value S2.

Figure 4:
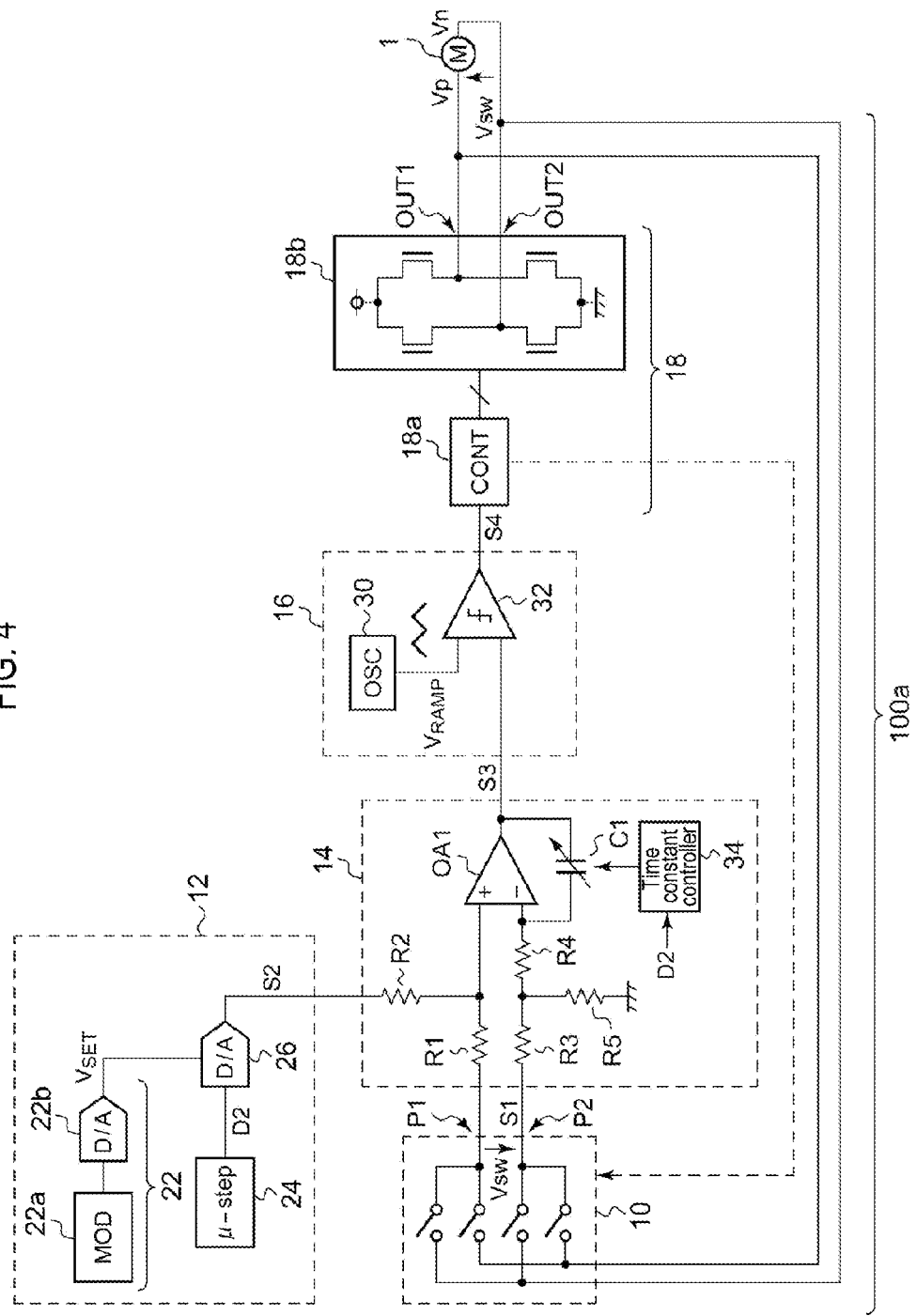
FIG. 4 is a circuit diagram of a motor driving circuit according to a second embodiment.

FIG. 4 is a circuit diagram of a motor driving circuit 100a according to the second embodiment. The time constant of the feedback loop can be changed by configuring a first capacitor C1, which is a feedback capacitor, as a variable capacitor and/or configuring a fourth resistor R4 as a variable resistor. In FIG. 4, the capacitor C1 has a variable capacitance and a time constant controller 34 changes the capacitance of the first capacitor C1.

The time constant controller 34 monitors the digital value D2 representing the command value S2 and sets the time constant to be longer, in other word, narrows a band of the feedback loop if the digital value D2 remains constant for a predetermined detection period τ. In a normal operation, such a fast response is secured by setting the time constant to be shorter. The detection period τ may be in the order of several milliseconds.

In addition, the set data generating portion 22a begins to vary the set data $D_{SET}$ after the digital value D2 remains constant for a predetermined period.

Figure 5:
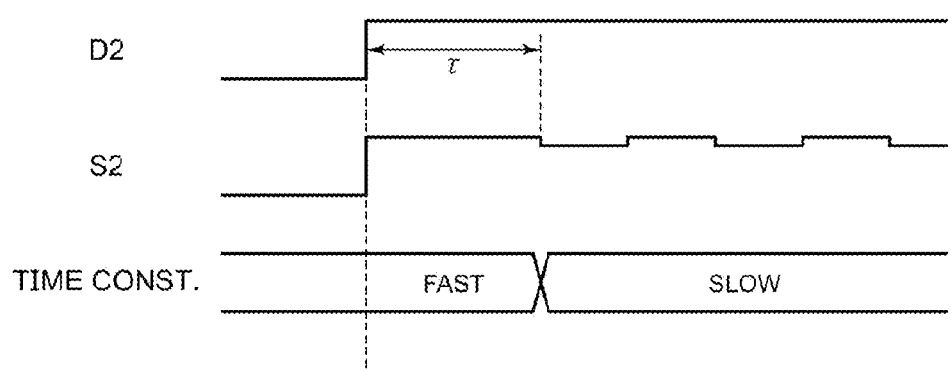
FIG. 5 is a waveform diagram showing an operation of the motor driving circuit of FIG. 4.

Subsequently, an operation of the motor driving circuit 100a will be described. FIG. 5 is a waveform diagram showing an operation of the motor driving circuit 100a of FIG. 4. At time t1, the digital value D2 representing the command value S2 is varied and thereafter remains at a constant value. After lapse of the detection period τ from time t1, the command value generating unit 12 begins to vary the command value S2. In addition, the time constant of the feedback loop is set to be larger at time t1 to provide a lower response speed.

According to the motor driving circuit 100a, a variation speed of the error signal S3 can be changed by varying the time constant of the feedback loop. Specifically, by setting the time constant of the feedback loop to have a larger value, i.e., lowering the response speed, it is possible to reduce a probability that the frequency of the pulse signal S4 falls within the audible band in the operation mode of FIG. 2B or 2C.

The second embodiment may have the following modifications. Control for the time constant in the second embodiment may be used alone. That is, the effect of reducing the audible noise can be achieved without varying the command value S2.

Third Embodiment

In a third embodiment, a periodic or random variation may be applied to a voltage range (bottom voltage) of the ramp signal $V_{RAMP}$ generated by an oscillator 30 in addition to or as an alternative to varying the command value S2. This allows variation of time at which the error signal S3 crosses the ramp signal $V_{RAMP}$ in the waveform diagram of FIG. 2C, which may result in a spread spectrum.

Fourth Embodiment

In a fourth embodiment, the frequency of the ramp signal $V_{RAMP}$ generated by the oscillator 30 may be changed in addition to or as an alternative to varying the command value S2. This also allows reduction in an audible noise, which may result in a spread spectrum in the vicinity of the zero-cross.

Fifth Embodiment

Figure 6:
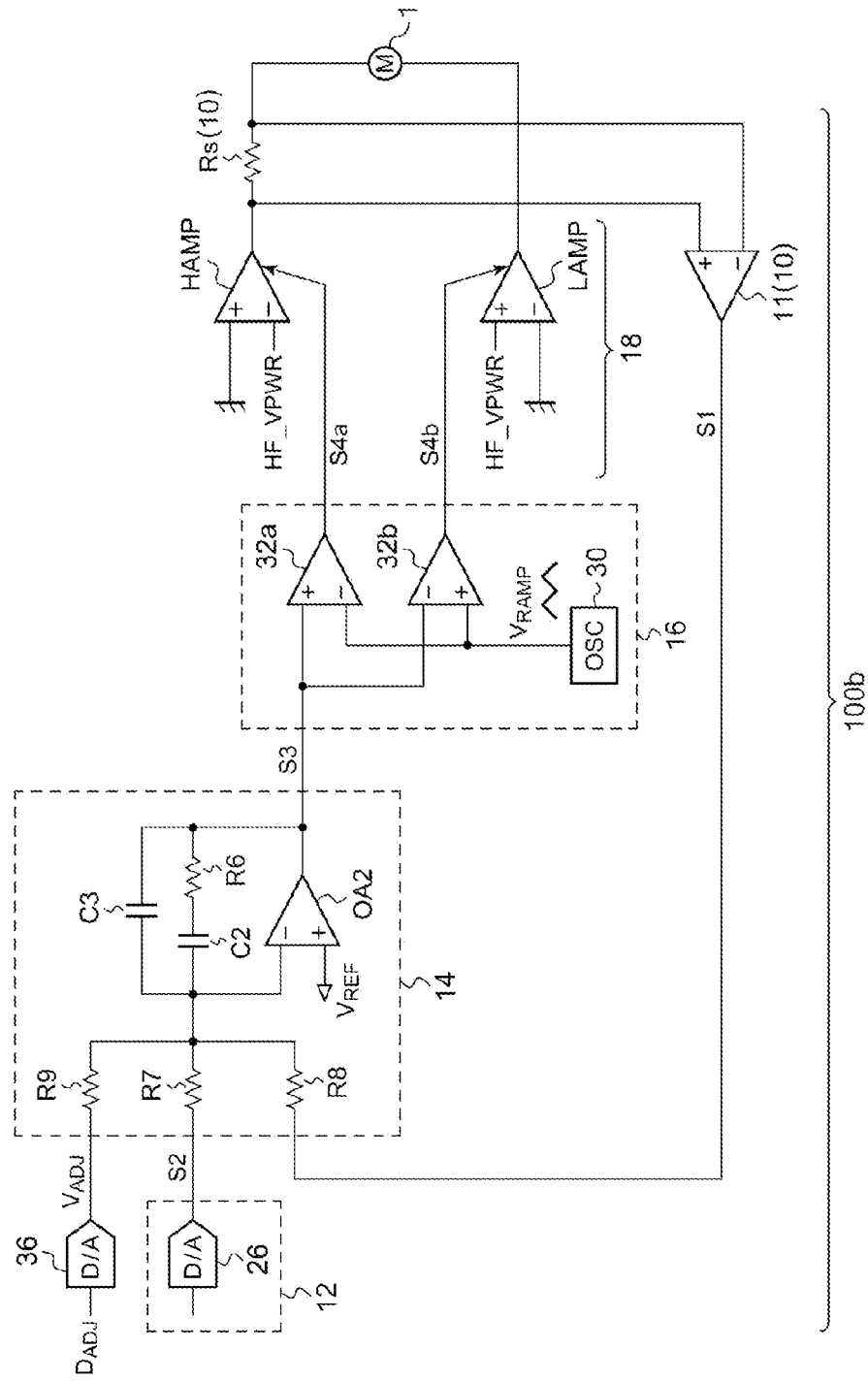
FIG. 6 is a circuit diagram of a motor driving circuit according to a fifth embodiment

In a fifth embodiment, the detection signal S1 may be generated based on a current flowing into the motor 1, unlike the first to fourth embodiments in which the detection signal S1 may be generated based on the driving voltage Vsw applied to the motor 1. FIG. 6 is a circuit diagram of a motor driving circuit 100b according to the fifth embodiment. The output circuit 18 includes a high side amplifier HAMP and a low side amplifier LAMP. The high side amplifier HAMP and the low side amplifier LAMP receive a driving voltage VF_VPWR and output respective voltages having opposite polarities. The respective output voltages of the high side amplifier HAMP and the low side amplifier LAMP are configured to be switchable based on pulse signals S4a and S4b, respectively. The high side amplifier HAMP and the low side amplifier LAMP are not particularly limited in their configuration but may be configured using any suitably known technique.

The detecting circuit 10 includes a detecting resistor Rs connected in series to the motor 1, and a sense amplifier 11 for generating the detection signal S1 by amplifying a voltage drop of the detecting resistor Rs. The detection signal S1 is proportional to an amount of the current flowing into the motor 1.

The command value generating unit 12 generates the command value S2. The command value generating unit 12 may have the same configuration as that in FIG. 1.

The error amplifier 14 amplifies an error between the detection signal S1 and the command value S2. In this embodiment, the error amplifier 14 is a summing-inverting amplifier, which amplifies an error between the sum (or average) of the detection signal S1 and the command value S2 and a reference voltage $V_{REF}$ and generates the error signal S3 whose value is such adjusted that the sum of the detection signal S1 and the command value S2 remains constant. But, any suitable amplifier may be used for amplifying the error between the detection signal S1 and the command value S2, instead of a summing-inverting amplifier.

The reference voltage $V_{REF}$ is applied to a non-inverted input terminal of an operational amplifier OA2. A sixth resistor R6 and a second capacitor C2 are connected in series between an output terminal of the operational amplifier OA2 and an inverted input terminal thereof. A third capacitor C3 is connected between the output terminal of the operational amplifier OA2 and the inverted terminal thereof. A seventh resistor R7 is connected between a terminal to which the command value S2 is input and the inverted input terminal of the operational amplifier OA2. An eighth resistor R8 is connected between a terminal to which the detection signal S1 is input and the inverted input terminal of the operational amplifier OA2.

An adjustment D/A converter 36 converts adjustment data $D_{ADJ}$, which is used to adjust an offset of the error amplifier 14, to an adjustment voltage $V_{ADJ}$. The error amplifier 14 may further include a ninth resistor R9 connected between an output terminal of the adjustment D/A converter 36 and the inverted input terminal of the operational amplifier OA2.

The pulse width modulator 16 generates the pulse signals S4a and S4b having the opposite phases and duty cycles depending on a level of the command value S2. The pulse width modulator 16 includes an oscillator 30 and PWM comparators 32a and 32b.

Like the first embodiment, the command value generating unit 12 is configured to vary the command value S2.

The motor driving circuit 100b of the current sense type can also achieve the same effects as the motor driving circuit 100 of FIG. 1.

Sixth Embodiment

In a sixth embodiment, the time constant of the feedback loop including the error amplifier 14 of FIG. 6 may be changed in addition to or as an alternative to varying the command value S2. Control of the time constant can be performed in the same manner and achieve the same effects as that of the second embodiment.

Seventh Embodiment

In a seventh embodiment, the oscillator 30 of FIG. 6 may be allowed to vary the voltage range (bottom voltage) of the ramp signal $V_{RAMP}$, in addition to or as an alternative to varying the command value S2. This can achieve the same effects as the third embodiment.

Eighth Embodiment

In an eighth embodiment, the oscillator 30 of FIG. 6 may be allowed to vary the frequency of the ramp signal $V_{RAMP}$, in addition to or as an alternative to varying the command value S2. This can achieve the same effects as the fourth embodiment.

Ninth Embodiment

In a ninth embodiment, a variation to the adjustment voltage $V_{ADJ}$ may be applied in addition to or as an alternative to varying the command value S2. Specifically, the adjustment data $D_{ADJ}$ input to the adjustment D/A converter 36 may be varied or a voltage of a reference voltage terminal of the adjustment D/A converter 36 may be varied. This can achieve the same effects as the fifth embodiment.

Figure 7A:
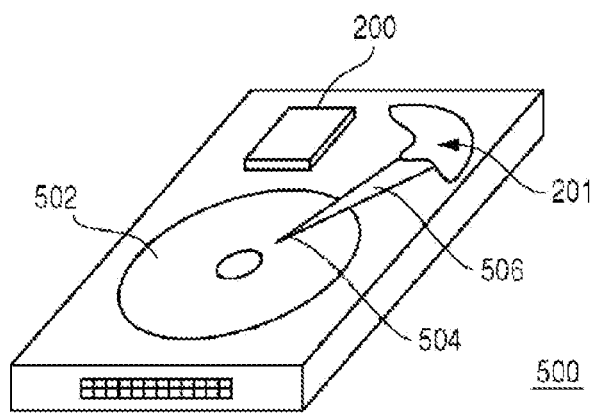
FIGS. 7A to 7C are perspective views showing examples of electronic apparatuses including the motor driving circuit.
Figure 7B:
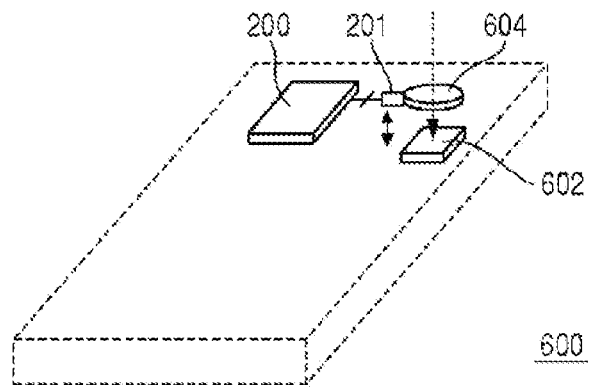
Figure 7C:
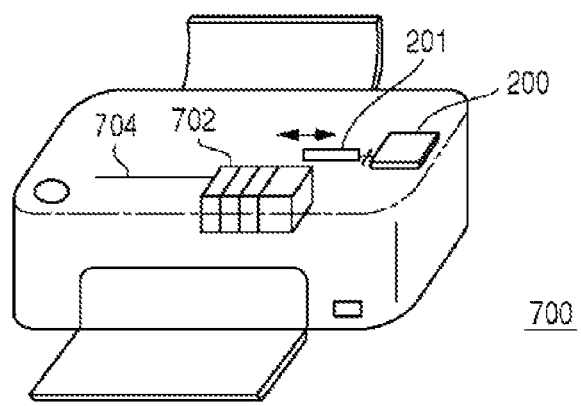

Finally, usage of the motor driving circuit 100 will be described. The motor driving circuit 100 may be employed for various kinds of electronic apparatuses. FIGS. 7A to 7C are perspective views showing examples of electronic apparatuses including the motor driving circuit 100.

An electronic apparatus shown in FIG. 7A is a hard disk device 500. The hard disk device 500 includes a magnetic disk 502, a head 504 and an arm 506. The head 504 is provided to write/read data into/from the magnetic disk 502. The head 504 is attached to a leading end of the arm 506 and a relative positional relationship between the head 504 and the magnetic disk 502 is controlled by changing a position of the arm 506. A motor 201 is provided to actuate the arm 506. The motor driving circuit 100 controls a voice coil motor 201. With this configuration, it is possible to position the head 504 with high precision.

An electronic apparatus shown in FIG. 7B is an imaging device 600, such as a digital still camera, a digital video camera, a mobile phone or the like. The imaging device 600 includes an imaging element 602 and an auto-focus lens 604. The voice coil motor 201 performs a positioning operation for the auto-focus lens 604. The motor driving circuit 100 can use this configuration of the voice coil motor 201 to position the auto-focus lens 604 with high precision. The motor driving circuit 100 may be used for driving of an image stabilizing lens (not shown) in addition to the auto-focus lens 604.

An electronic apparatus shown in FIG. 7C is a printer 700. The printer 700 includes a head 702 and a guide rail 704. The head 702 is supported along the guide rail 704 in a positionable manner. The voice coil motor 201 controls a position of the head 702. The motor driving circuit 100 controls the voice coil motor 201. This configuration allows the head 702 to be positioned with high precision. The motor driving circuit 100 may be used for driving of a motor (not shown) for paper feeding mechanism in addition to the head 702.

The present disclosure has been described on the basis of the various embodiments in the above. However, these embodiments are only illustrative and it is to be understood by those skilled in the art that combinations of various elements thereof and combinations of various processes thereof may be modified in different ways and such modifications fall within the scope of the present disclosure. Some of the modifications will be described below.

While it has been illustrated in the above embodiments that the output circuit 18 has a full bridge configuration (or BTL (Bridged Transless) type), the present disclosure is not limited thereto, but an output stage of the output circuit 18 may be configured as a half-bridge circuit.

The first to fourth embodiments can be combined in a random manner. Similarly, the fifth to ninth embodiments can be combined in a random manner. These combinations are intended to fall within the scope of the present disclosure.

While it has been illustrated in the above embodiments that current or voltage is detected as a motor state, a motor speed may be detected instead. A detection signal depending on the motor speed (rpm) can be generated by using an output of a Hall element or a rotary encoder. For a senseless motor, a detection signal depending on the motor speed can be generated by monitoring a counter-electromotive force.

According to some embodiments of the present disclosure, it is possible to suppress or reduce audible noises.

While certain embodiments have been described, these embodiments have been presented by way of example only, and are not intended to limit the scope of the present disclosure. Indeed, novel methods and apparatuses described herein may be embodied in a variety of other forms; furthermore, various omissions, combinations, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A motor driving circuit for driving a motor, comprising:
    a detecting circuit configured to detect a detection signal indicative of a current state of the motor;
    a command value generating unit configured to generate a command value indicative of a target state of the motor;
    an error amplifier configured to generate an error signal by amplifying an error between the detection signal and the command value;
    a pulse width modulator configured to generate a pulse signal having a duty cycle corresponding to the error signal; and
    an output circuit configured to apply a switching voltage having a duty cycle corresponding to the pulse signal across the motor,
    wherein the command value generating unit is configured to provide a variation to the command value,
    wherein the command value generating unit includes:
        a set voltage generating part configured to generate a set voltage; and
        a first D/A converter configured to generate the command value, the first D/A converter having a reference voltage terminal receiving the set voltage and an input terminal receiving a digital value representing the command value,
    wherein the set voltage generating part is configured to provide a variation to the set voltage, and
    wherein the set voltage generating part modulates the set voltage with a predetermined frequency.

2. The motor driving circuit of claim 1, wherein the set voltage generating part includes:
    a set data generating portion configured to generate digital set data corresponding to the set voltage; and
    a second D/A converter configured to convert the set data into an analog set voltage, and
    wherein the set data generating portion is configured to provide a variation to the set data.

3. The motor driving circuit of claim 2, wherein the set data generating portion varies the set data by one LSB (Least Significant Bit) at a predetermined period.

4. The motor driving circuit of claim 1, wherein the command value generating unit includes:
    a micro step generating part configured to generate a digital value representing the command value and
    wherein the micro step generating part is configured to provide a variation to the digital voltage.

5. The motor driving circuit of claim 1, wherein the detecting circuit generates a detection signal representing a voltage applied to the motor.

6. The motor driving circuit of claim 5, wherein the detecting circuit is configured to have a first output terminal from which one of voltages of first and second terminals of the motor is output, the one voltage having a fixed voltage level, and a second output terminal from which the other of voltages of first and second terminals of the motor is output, the other voltage being switched, and
    wherein the error amplifier includes:
    an operational amplifier;
    a first capacitor connected between an inverted input terminal of the operational amplifier and a non-inverted input terminal thereof;
    a first resistor connected between the non-inverted input terminal of the operational amplifier and the first output terminal of the detecting circuit;
    a second resistor connected between the non-inverted input terminal of the operational amplifier and an output terminal of the command value generating unit;
    third and fourth resistors connected in series between the second output terminal of the detecting circuit and the inverted input terminal of the operational amplifier; and
    a fifth resistor connected between a node between the third resistor and the fourth resistor and a ground terminal.

7. The motor driving circuit of claim 1, wherein the detecting circuit generates a detection signal representing a current flowing into the motor.

8. The motor driving circuit of claim 1, wherein the detecting circuit generates a detection signal representing a speed of the motor.

9. A motor driving circuit for driving a motor, comprising:
    a detecting circuit configured to detect a detection signal indicative of a current state of the motor;
    a command value generating unit configured to generate a command value indicative of a target state of the motor;
    an error amplifier configured to generate an error signal by amplifying an error between the detection signal and the command value;
    a pulse width modulator configured to generate a pulse signal having a duty cycle corresponding to the error signal; and
    an output circuit configured to apply a switching voltage having a duty cycle corresponding to the pulse signal across the motor,
    wherein a feedback loop including the error amplifier is configured to vary a time constant of the feedback loop,
    wherein the command value generating unit includes:
    a set voltage generating part configured to generate a set voltage; and
    a first D/A converter configured to generate the command value, the first D/A converter having a reference voltage terminal receiving the set voltage and an input terminal receiving a digital value representing the command value,
    wherein the set voltage generating part is configured to provide a variation to the set voltage, and
    wherein the set voltage generating part modulates the set voltage with a predetermined frequency.

10. The motor driving circuit of claim 9, wherein the time constant is set to have a larger value if the command value remains at a constant value for a predetermined period.

11. The motor driving circuit of claim 9, wherein the error amplifier includes:
   an operational amplifier; and
   a variable feedback capacitor connected between an output of the operational amplifier and an input thereof.

12. The motor driving circuit of claim 9, wherein the error amplifier includes:
   an operational amplifier having a non-inverted input terminal to which a reference voltage is input;
   a sixth resistor and a second capacitor connected in series between an output terminal of the operational amplifier and an inverted input terminal thereof;
   a third capacitor connected between the output terminal of the operational amplifier and an inverted terminal thereof;
   a seventh resistor connected between a terminal to which the command value is input and the inverted input terminal of the operational amplifier; and
   an eighth resistor connected between a terminal to which the detection signal is input and the inverted input terminal of the operational amplifier.

13. The motor driving circuit of claim 9, wherein the detecting circuit generates a detection signal representing a current flowing into the motor.

14. The motor driving circuit of claim 13, wherein the detecting circuit includes:
   a detecting resistor connected in series to the motor; and
   a sense amplifier configured to amplify a voltage drop of the detecting resistor.

15. The motor driving circuit of claim 9, wherein the detecting circuit generates a detection signal representing a voltage applied to the motor.

16. The motor driving circuit of claim 9, wherein the detecting circuit generates a detection signal representing a speed of the motor.

17. The motor driving circuit of claim 1, wherein the motor driving circuit is integrated into a single semiconductor substrate.

18. An electronic apparatus comprising:
   a motor; and
   a motor driving circuit of claim 1 for driving the motor.

* * * * *